(12) United States Patent
Scheid et al.

(10) Patent No.: US 8,362,607 B2
(45) Date of Patent: Jan. 29, 2013

(54) INTEGRATED CIRCUIT PACKAGE INCLUDING A THERMALLY AND ELECTRICALLY CONDUCTIVE PACKAGE LID

(75) Inventors: David Scheid, Eau Claire, WI (US); Ronald James Jensen, Bloomington, MN (US)

(73) Assignee: Honeywell International Inc., Morristown, NJ (US)

( * ) Notice: Subject to any disclaimer, the term of this patent is extended or adjusted under 35 U.S.C. 154(b) by 220 days.

(21) Appl. No.: 12/455,574

(22) Filed: Jun. 3, 2009

(65) Prior Publication Data

US 2010/0308453 A1    Dec. 9, 2010

(51) Int. Cl.
*H01L 23/10*    (2006.01)
*H01L 23/34*    (2006.01)
(52) U.S. Cl. ......... 257/707; 257/704; 257/706; 438/122
(58) Field of Classification Search ............... 257/706, 257/707, 686, 777, 704; 438/122, 121
See application file for complete search history.

(56) References Cited

U.S. PATENT DOCUMENTS

| | | | |
|---|---|---|---|
| 5,552,635 A | 9/1996 | Kim et al. | |
| 5,572,070 A | 11/1996 | Ross | |
| 5,633,533 A * | 5/1997 | Andros et al. | 257/707 |
| 5,705,851 A | 1/1998 | Mostafazadeh et al. | |
| 5,977,626 A * | 11/1999 | Wang et al. | 257/707 |
| 6,144,101 A * | 11/2000 | Akram | 257/778 |
| 6,432,511 B1 | 8/2002 | Davis et al. | |
| 6,580,167 B1 * | 6/2003 | Glenn et al. | 257/718 |
| 6,667,546 B2 * | 12/2003 | Huang et al. | 257/691 |
| 6,713,863 B2 * | 3/2004 | Murayama et al. | 257/707 |
| 6,747,350 B1 * | 6/2004 | Lin et al. | 257/704 |
| 6,785,137 B2 | 8/2004 | Siegel | |
| 6,849,940 B1 | 2/2005 | Chan et al. | |
| 6,936,919 B2 * | 8/2005 | Chuang et al. | 257/717 |
| 7,126,218 B1 * | 10/2006 | Darveaux et al. | 257/706 |
| 7,180,174 B2 | 2/2007 | Koning et al. | |
| 7,217,997 B2 | 5/2007 | Wyland | |
| 7,323,769 B2 * | 1/2008 | Tan et al. | 257/684 |
| 7,423,341 B2 | 9/2008 | Crispell et al. | |
| 7,566,590 B2 * | 7/2009 | Zhong et al. | 438/119 |
| 7,813,133 B2 * | 10/2010 | Iijima et al. | 361/710 |
| 2005/0218506 A1 * | 10/2005 | Geisler et al. | 257/703 |
| 2006/0097381 A1 | 5/2006 | Akram | |
| 2008/0272482 A1 | 11/2008 | Jensen et al. | |

* cited by examiner

*Primary Examiner* — Sheila V Clark
(74) *Attorney, Agent, or Firm* — Shumaker & Sieffert, P.A.

(57) ABSTRACT

An integrated circuit package includes a thermally and electrically conductive package lid. The package lid may be in electrical communication with an electrically conductive pad connected to a power plane, ground plane, or signal route in the integrated circuit. The electrically conductive package lid may provide an electrical connection for electrical power or electrical signals or may serve as an electrical ground. In some embodiments, the package lid may include a thermally and electrically conductive material. In other embodiments, the package lid may include an electrically insulative substrate coated on at least one surface with a layer of metal or another conductive material. The conductive layer may be electrically connected to electrical ground, a reference voltage, or a signal pay by at least one electrically conductive via.

19 Claims, 7 Drawing Sheets

INTEGRATED CIRCUIT PACKAGE INCLUDING A THERMALLY AND ELECTRICALLY CONDUCTIVE PACKAGE LID

TECHNICAL FIELD

The disclosure relates to integrated circuit packaging.

BACKGROUND

Integrated circuits (ICs) generate heat. To help prevent excessive operating temperatures, the heat can be dissipated through a thermal pathway including an IC package that houses the IC. Packages used in avionics or space applications are typically cooled by conduction from the bottom of a package into a printed wiring board (PWB).

Many high pincount IC packages use pins or balls on the bottom of a package for electrical connection to a PWB, which increases the thermal resistance between the package and the PWB compared to perimeter leaded packages with full bottom side contact to the PWB. Furthermore, as PWB complexity increases, the number of layers in the PWB increases, and the heat from the IC package is conducted through multiple layers (often through vias) before being conducted to the edge of the PWB, which further increases the thermal resistance of this conduction path. To alleviate these problems, emerging hardware designs attempt to remove heat from the top of the package through heat sinks, heat pipes, cooling plates, or other thermally conducting structures.

Standard hermetically-sealed ceramic packages used in avionics or space applications have a high thermal resistance or a poor thermal conduction path from the IC to the top side of the package. A large air gap also exists between the IC and the lid, further impeding heat conduction. Generally, the only conduction path to the top of the package is laterally through the package to the lid, and laterally across the lid.

SUMMARY

In general, the disclosure is directed to an integrated circuit (IC) package including an electrically and thermally conductive package lid. In some embodiments described herein, the package lid is directly or indirectly electrically connected to an electrically conductive portion of the IC. The electrically conductive portion may be electrically connected to a signal route, power plane, or ground plane in the IC. In some examples, the package lid provides an additional electrical connection to the power or ground potential, or may provide a signal input to or output from the IC. In some embodiments, the package lid may include, for example, aluminum silicon carbide (AlSiC), copper tungsten (CuW), copper molybdenum (CuMo), or the like.

In some embodiments, the package lid may include a substantially electrically insulative substrate coated on at least one surface with a layer of metal or another conductive material. The at least one conductive layer may be electrically connected to a reference voltage or a signal route by at least one electrically conductive via in the package lid. The at least one electrically conductive via may be connected to the reference voltage or signal route through a conductive path in package base, through package leads connecting the at least one electrically conductive via to a printed wire board, or through a metal layer on a second surface of the substantially electrically insulative substrate. The at least one conductive layer may provide an additional contact for ground potentials, power potentials, or electrical signals.

In one aspect, the disclosure is directed to a system including a package base, an IC attached to the package base, and an electrically and thermally conductive package lid. The IC comprises an electrically conductive layer that is electrically connected to the package lid. The electrically and thermally conductive package lid is also in thermal communication with the IC.

In another aspect, the disclosure is directed to a system including a package base and an IC attached to the package base. The IC comprises an electrically conductive layer and a passivation layer, where the passivation layer defines a plurality of openings that expose the electrically conductive layer to define a plurality of electrically conductive portions. The system further includes a package lid comprising a substantially electrically nonconductive substrate defining a surface, a metal layer applied to the surface of the substrate, an electrically conductive plane, and an electrically conductive via electrically connecting the metal layer and the electrically conductive plane. According to this aspect of the disclosure, the first metal layer is electrically connected to at least one of the electrically conductive portions of the IC.

In another aspect, the disclosure is directed to a method including forming a plurality of openings in a passivation layer of an IC to define a plurality of electrically conductive portions, attaching the IC to a package base, applying an electrically and thermally conductive interface material over at least one of the electrically conductive portions, and placing an electrically and thermally conductive package lid over the IC. According to this aspect of the disclosure, a first portion of the package lid contacts the interface material and a second portion of the package lid contacts the package base.

The details of one or more examples of the disclosure are set forth in the accompanying drawings and the description below. Other features, objects, and advantages of the disclosure will be apparent from the description and drawings, and from the claims.

DETAILED DESCRIPTION

In general, the disclosure is directed to an integrated circuit (IC) package including an electrically and thermally conductive package lid. The package lid may be directly or indirectly (e.g., via an interface material) electrically connected to a conductive portion (also referred to herein as a conductive pad) in the IC, which may be connected to or integral with a signal route, ground plane, or power plane of the IC. The electrical communication between the IC and the package lid enables the package lid to provide an additional input or output connection for electrical power, electrical signals or an electrical ground. In some embodiments, the package lid includes, for example, at least one of aluminum silicon carbide (AlSiC), copper tungsten (CuW), copper molybdenum (CuMo), or the like.

In some embodiments, the package lid includes a single layer of an electrically and thermally conductive material. In other embodiments, the package lid is a multilayer structure including at least one layer that is more electrically conductive than another layer. For example, the package lid can include a substantially electrically insulative ceramic substrate coated on at least one surface with a metal or another conductive material. The conductive coating may be electrically connected to an electrical ground or power source or an electrical signal route by at least one via in the IC package lid or base, and may provide an additional connection for electrical signals, electrical power, or an electrical ground.

Figure 1:
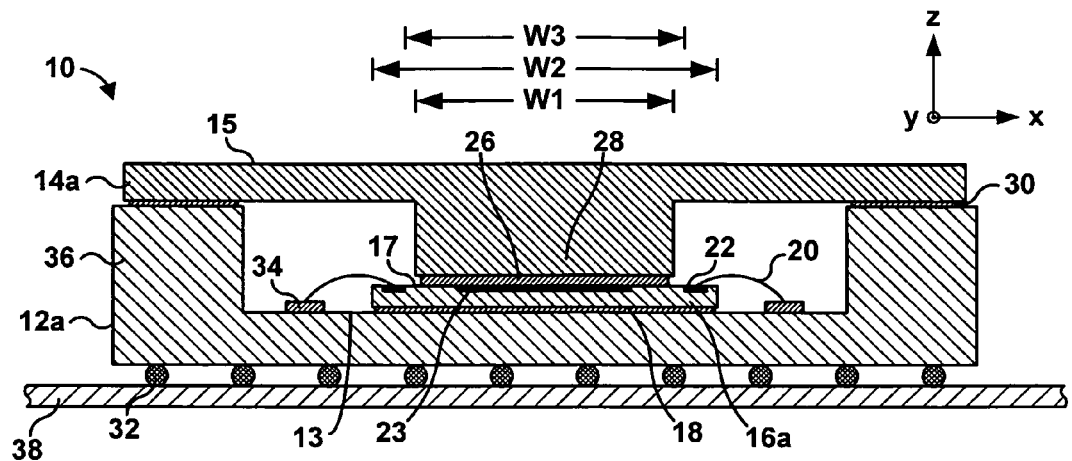
FIG. 1 is a cross-sectional diagram illustrating an example integrated circuit (IC) package including an electrically and thermally conductive package lid.

FIG. 1 illustrates an example IC package 10. IC package 10 includes a package base 12a and an electrically and thermally conductive package lid 14a. Package base 12a defines a cavity for housing IC 16a. When assembled, package lid 14a covers the cavity to substantially enclose IC 16a in the cavity. IC 16a may be adhered or otherwise attached to package base 12a by, for example, a layer of adhesive 18. In the example shown in FIG. 1, IC 16a is attached to bottom surface 13 of package base 12a. In addition, in the embodiment illustrated in FIG. 1, IC 16a is wire bonded to package base 12a via a plurality of wires 20. However, in other embodiments, IC 16a may have other configurations within package base 12a. For example, IC 16a can be a flip-chip that is oriented face down (see FIG. 5) and electrically connected to package base 12a via electrical contacts on the downward-oriented face of IC 16a.

Wires 20 electrically connect conductive pads 22 on IC 16a to conductive pads and/or traces 34 on package base 12a to provide electrical communication between IC 16a and package base 12a, and, ultimately, a printed wiring board (PWB) 38 to which IC package 10 is electrically connected. Conductive pads 22 may electrically connect to circuitry within IC 16a or a ground plane in IC 16a. Conductive pads 22 may be formed by etching or otherwise removing a passivation layer from top surface 17 of IC 16a to expose an underlying conductive layer and define separate conductive pads 22. The passivation layer may include, for example, silicon nitride ($SiN_x$), silicon dioxide ($SiO_2$), polyimide, or another oxide or nitride. In some embodiments, the passivation layer may comprise a porous oxide.

Figure 2A:
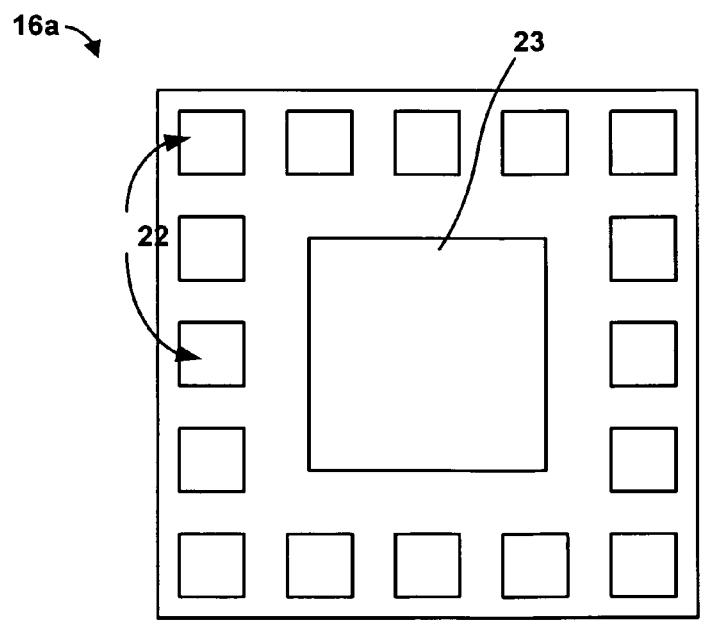
FIGS. 2A and 2B are conceptual diagrams illustrating examples of ICs including a plurality of openings formed in a passivation layer to expose conductive pads.
Figure 2B:
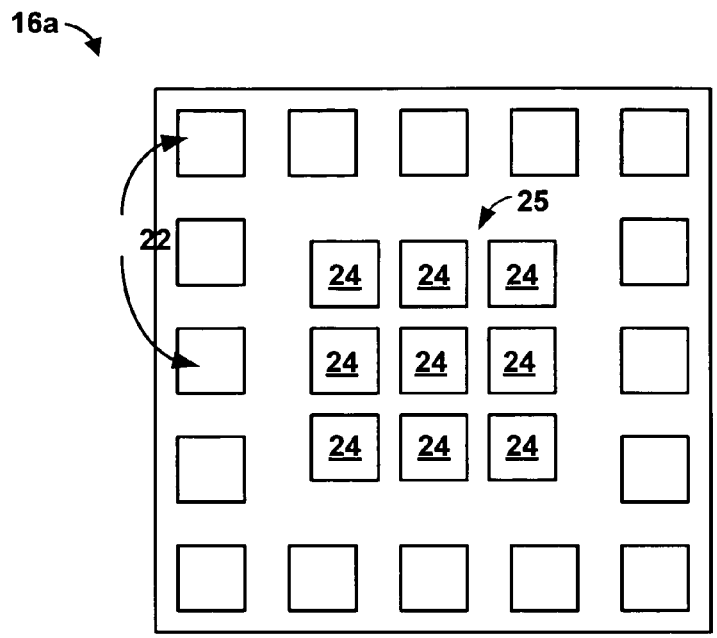

As shown in FIGS. 2A and 2B, IC 16a may include a plurality of conductive pads 22 disposed proximate to the perimeter of IC 16a. In the example shown in FIGS. 2A and 2B, conductive pads 22 are distributed around an outer perimeter of IC 16a. In some examples, respective ones of conductive pads 22 may connect to different circuitry or different connection points within circuitry in IC 16a, although two or more conductive pads 22 may connect to a common connection point.

Conductive traces 34 may be electrically connected to solder balls 32, which may be used to electrically connect IC package 10 to PWB 38. In other embodiments, an electrical connection between IC package 10 and PWB 38 may be made through a plurality of pins disposed along the bottom surface of package base 12a, a plurality of solder columns disposed along the bottom surface of package base 12a, or a plurality of package leads around the perimeter of package base 12a (see FIG. 3).

IC 16a may generate heat during operation of its circuitry. In some embodiments, at least a portion of the heat generated by IC 16a may be conducted through adhesive 18 and into package base 12a. A portion of the heat transferred to the package base 12a may be conducted to PWB 38, while another portion may be transferred to the package lid 14a through sealing material 30.

In addition, at least a portion of the heat generated by IC 16a may be conducted away from IC 16a through top surface 17 of IC 16a, through interface material 26, and to a mesa portion 28 of package lid 14a. Package lid 14a provides a relatively low resistance thermal conduction path between IC 16a and a top side of IC package 10. The relative size of package lid 14a and IC 16a enables package lid 14a to act as a heat spreader that conducts heat in a z-axis direction (e.g., in an direction substantially perpendicular to top surface 17 of IC 16a), as well as in x-axis and y-axis directions (e.g., in a direction substantially parallel to top surface 17 of IC 16a). In this way, thermally conductive package lid 14a spreads the heat generated by IC 16a over at least a portion of a top surface 15 of lid 14a. Orthogonal x-z axes are shown in FIG. 1 for ease of description of FIG. 1. In some embodiments, an external heat sink or cooling plate is coupled to top surface 15 of package lid 14a to maintain a temperature differential between the lid 14a and IC 16a to assist in dissipating heat away from IC 16a by thermal conduction.

As described in commonly-assigned U.S. Patent Application Publication No. 2008/0272482 to Jensen et al., which is entitled, "INTEGRATED CIRCUIT PACKAGE WITH TOP-SIDE CONDUCTION COOLING," and was filed on Mar. 23, 2007, increasing a thickness of package base 12a or package lid 14a (where thickness is measured substantially along the z-axis direction in FIG. 1) may help increase the cross-section of thermal conduction paths through package base 12a and to lid 14a, which improves thermal conduction. U.S. Patent Application Publication No. 2008/0272482 to Jensen et al. is incorporated herein by reference in its entirety.

Because one or both of package base 12a and package lid 14a may be used to dissipate heat generated by IC 16a, at least one of base 12a or lid 14a may comprise a material having a relatively high thermal conductivity. In some embodiments, package lid 14a is configured to dissipate more heat generated by IC 16a than package base 12a. Thus, in some embodiments, package lid 14a comprises a material that has a higher thermal conductivity than package base 12a. In this way, a thermal conduction path through a top surface 17 of IC 16a and including package lid 14a may have a lower resistance than a thermal conduction path through a bottom surface of IC 16a.

In addition to being thermally conductive, package lid 14a may be electrically conductive and either directly (e.g., via direct electrical contact) or indirectly (e.g., via an electrically conductive interface material) electrically connected to IC 16a. In the example shown in FIGS. 1 and 2A, package lid 14a is electrically connected to central conductive pad 23, which is separate from conductive pads 22 distributed around an outer perimeter of IC 16a. However, in some examples, package lid 14a can be electrically connected to one or more of conductive pads 22.

An electrical connection does not need to be made between central conductive pad 23 and a conductive trace 34 of package base 12a, thereby enabling conductive pad 23 to be located away from the perimeter of IC 16a and between the set of conductive pads 22 that are arranged around the outer perimeter of IC 16a. Package lid 14a electrically connects to central conductive pad 23 from a top side of IC 16a, and, as a result, the relatively central location of central conductive pad 23 does not interfere with the ability to make an electrical connection to central conductive pad 23. Central conductive pad 23 may be defined in top surface 17 of IC 16a by etching or otherwise removing a portion of a passivation layer from top surface 17 to expose a conductive layer in IC 16a.

Central conductive pad 23 that is defined in a passivation layer of IC 16a in addition to conductive pads 22 increase the number of available electrical connections to IC 16a. In existing IC packages, at least some of conductive pads 22 (e.g., up to 10% to 25% of conductive pads 22) electrically connect circuitry in IC 16a to ground. In the example shown in FIG. 1, package lid 14a can be a ground for IC 16a. Because package lid 14a is configured to electrically connect to a central conductive pad 23 that is separate from the conductive pads 22, the use of package lid 14a as a ground may reduce the need to use some of conductive pads 22 to connect circuitry in IC 16a to ground. Freeing up conductive pads 22 may be particularly desirable because the number of conductive pads 22 on IC 16a may be limited by the size of the outer perimeter of the IC 16a and the minimum size with which each of conductive pads 22 may be formed.

Conductive pads 22 provide signal input and output pathways for IC 16a. Accordingly, a package lid 14a comprising an electrically conductive material may allow a greater number of conductive pads 22 and wires 20 to provide signal input to and output from IC 16a. In this way, an electrically conductive package lid 14a increases the signal input and output capabilities of IC 16a by freeing up conductive pads 22 that would ordinarily be used to connect IC 16a to ground. Increasing the signal input and output capabilities of IC 16a may help increase the functionality of IC 16a.

A package lid 14a that is electrically conductive and acts as a ground for IC 16a may also decrease the resistance of the path to a ground connection for circuitry of IC 16a. In examples in which one or more of conductive pads 22 electrically connect circuitry in IC 16a to ground, the electrical connection may traverse from the respective conductive pad 22 to a respective conductive trace 34, which is then electrically connected to PWB 38 through package base 12a.

In some embodiments, such as embodiments in which package lid 14a acts as a ground, central conductive pad 23 may connect to or comprise a ground plane of IC 16a. Package lid 14a may then be in electrical communication with central conductive pad 23 through interface material 26, which may include a thermally and electrically conductive material. In some examples, interface material 26 helps improve heat conduction from IC 16a into package lid 14a. In other embodiments, central conductive pad 23 may connect to or comprise a power plane or signal route, and package lid 14a may be used to communicate electrical power or electrical signals to and/or from the power plane or signal route.

In some embodiments, instead of a single central conductive pad 23, IC 16a may include at least two central conductive pads arranged in an array in top surface 17 of IC 16a. As illustrated in FIG. 2B a plurality of central conductive pads 24 may define an array 25 of conductive pads that is arranged between conductive pads 22, which are arranged around an outer perimeter of top surface 17. The array 25 of conductive pads 24 is arranged substantially in the center of top surface 17 of IC 16a between conductive pads 22 may be used to provide an electrical connection to a ground plane, a power plane, or a signal route. In some embodiments, each of the central conductive pads 24 connects to a separate ground plane, power plane, or signal plane. In other embodiments, at least two of the central conductive pads 24 of array 25 may connect to a common ground plane, power plane, or signal plane. The use of a plurality of separate central conductive pads 24 may facilitate routing of electrical connections in the conductive layers of IC 16a between respective conductive pads 22 or central conductive pads 24. In some examples, each conductive pad 24 in array of conductive pads 25 has a smaller area than central conductive pad 23 shown in FIG. 2A.

As shown in FIG. 1, package lid 14a may be formed to include a mesa portion 28 that extends from a base of package lid 14a towards top surface 17 of IC 16a. Mesa portion 28 helps to electrically connect IC 16a to package lid 14a, as well as provide an improved thermal conduction path from IC 16a to lid 14a. Mesa portion 28 has a width W1 that is smaller than a width W2 of IC 16a. More specifically, mesa portion 28 may have a width W1 that is less than an inner width W3 defined between conductive pads 22 disposed substantially opposite each other. In this way, direct electrical contact between package lid 14a and conductive pads 22 may be substantially prevented. Widths W1, W2, and W3 may be measured in a direction substantially parallel to top surface 15 of lid 14a. In some embodiments, width W1 of mesa portion 28 is as large as possible without contacting conductive pads 22 or wires 20 in order to increase a contact area between package lid 14a and IC 16 and increase thermal conduction between IC 16a and mesa portion 28.

In some embodiments, as illustrated in FIG. 1, a gap may remain between top surface 17 of IC 16a and mesa portion 28. The gap may be at least partially filled with interface material 26. The interface material 26 may be disposed between lid 14a and IC 16a so as not to make contact with conductive pads 22 or wires 20.

Interface material 26 may include a low modulus, easily deformed, electrically conductive material with high thermal conductivity. Such materials may comprise, for example, a polymer in the form of a gel, paste, or preform (e.g., a tape) filled with thermally and electrically conductive particles such as metal or ceramic powders or particles. For example, interface material 26 may include a silver-filled epoxy or the like. Utilizing such a material may improve conduction of heat from IC 16*a* to mesa portion 28 of package lid 14*a* and may provide a preferential thermal conduction pathway away from IC 16*a*.

Package lid 14*a* may comprise an electrically and thermally conductive material, as described above. Such materials include, but are not limited to, aluminum silicon carbide (AlSiC), copper tungsten (CuW), copper molybdenum (CuMo), or the like. In general, package lid 14*a* may comprise an electrically conductive material that has a thermal conductivity of greater than approximately 50 watts per meter-Kelvin (W/mK). In some embodiments, package lid 14*a* may comprise an electrically conductive material that has a thermal conductivity of greater than approximately 150 W/mK. For example, AlSiC may have a thermal conductivity of approximately 170 W/mK to approximately 200 W/mK, CuW may have a thermal conductivity of approximately 170 W/mK to approximately 180 W/mK, and CuMo may have a thermal conductivity of approximately 160 W/mK to approximately 170 W/mK.

Another consideration in selecting a material from which to form package lid 14*a* may be the coefficient of thermal expansion (CTE) of the material. In some embodiments, package lid 14*a* may be attached to package base 12*a* and sealed with sealing material 30 to form a hermetic IC package 10. Sealing material 30 may include, for example, gold-tin (AuSn), gold-germanium (AuGe), tin-lead (SnPb), metal filled glasses, or lead free solder (e.g., tin-silver-copper alloys). Sealing material 30 can seal lid 14*a* to base 12*a* to form a hermetic package. Alternatively, a near-hermetic or non-hermetic package may be defined by sealing material 30 that includes polymeric adhesives. The adhesives may be filled with thermally and/or electrically conductive particles such as silver, gold, AlN, SiC, or diamond. The sealing material 30 may be thermally conductive and may allow heat to flow between package base 12*a* and package lid 14*a*.

Sealing material 30 may substantially prevent relative motion between package lid 14*a* and package base 12*a*, which may result in stress to sealing material 30, package base 12*a*, and/or package lid 14*a* during heating and cooling of package lid 14*a* and package base 12*a* if the CTEs of the lid 14*a* and base 12*a* are not substantially similar. When the CTEs of package lid 14*a* and package base 12*a* match more closely, the stress on sealing material 30, package base 12*a*, and/or package lid 14*a* may be decreased compared to when the CTEs of package lid 14*a* and package base 12*a* match less closely. Because of this, it may be desirable for the CTEs of package lid 14*a* and package base 12*a* to be approximately the same in some examples.

The CTE of AlSiC may depend on the precise composition of the AlSiC, i.e., the ratio of Al to SiC. The ability to form AlSiC with a CTE within a range of CTEs may allow a package lid 14*a* comprising AlSiC to be used with a package base 12*a* comprising one or more of a variety of materials, as described below. In addition, the CTE of AlSiC may change depending on the environmental temperature. For example, AlSiC including approximately 60 vol. % SiC and approximately 40 vol. % Al may have a CTE of approximately 6.5 ppm/° C. at approximately 25° C. and a CTE of approximately 9 ppm/° C. at approximately 150° C.

CuW may have a CTE that may be adjusted within a range by changing the ratio of Cu and W. For example, a composition of twenty parts copper to eighty parts W may have a CTE of approximately 7.0 ppm/° C., while a composition of ten parts copper to ninety parts tungsten may have a CTE of approximately 6.0 ppm/° C. Similar to AlSiC, the ability to form CuW with a CTE within a range of CTEs may allow a package lid 14*a* comprising CuW to be used with a package base 12*a* comprising one or more of a variety of materials. The CTE of CuW may also change as the temperature of the material changes. For example, CuW including between approximately 10 vol. % and 20 vol. % Cu may have a CTE of approximately 6.5 ppm/° C. at approximately 25° C. and a CTE of approximately 8.3 ppm/° C. at approximately 150° C.

CuMo also may have a CTE that may be adjusted within a range by changing the ratio of Cu and Mo. In addition, the CTE of CuMo may change as the temperature of the material changes. For example, in an embodiment including between approximately 15 vol. % Mo and approximately 20 vol. % Mo and a balance Cu, the CTE may be approximately 7 ppm/° C. at approximately 25° C. and approximately 8 ppm/° C. at approximately 150° C.

Package base 12*a* may comprise, for example, an alumina and aluminum nitride (AlN) multi-layer interconnect substrate, beryllium oxide (BeO) with thick film redistribution layers, or the like. Alumina may have a relatively low thermal conductivity (e.g., approximately 14 W/mK) and thus may limit the amount of heat conducted from IC 16*a* to package base 12*a*. AlN and BeO may have a higher thermal conductivity (e.g., approximately 150 W/mK and approximately 260 W/mK, respectively) compared to alumina, and, thus, allow a greater amount of heat to be transferred from IC 16*a* to package base 12*a* compared to a package base 12*a* formed of alumina. In some embodiments in which a hermetic IC package 10 is not required, package base 12*a* may include, for example, a liquid crystal polymer. A liquid crystal polymer may not be strictly hermetic, as it may permit slow diffusion of water or other materials into the interior of IC package 10. Thus, an IC package 10 including a package base 12*a* formed of a liquid polymer may be classified as providing a near-hermetic package.

In order to minimize stress between package base 12*a* and package lid 14*a* resulting from dimensional changes (e.g., expansion and contraction) of package base 12*a* and package lid 14*a* during temperature changes, base 12*a* and lid 14*a* may be formed from materials that have similar CTEs. For example, as described above, package base 12*a* may comprise alumina, AlN, or BeO. Alumina may have a CTE of approximately 7 ppm/° C., AlN may have a CTE of approximately 4.5 ppm/° C., and BeO may have a CTE of approximately 7.2 ppm/° C. Accordingly, the preferred material for package lid 14*a* may depend of the composition of the package base 12*a*. For example, a package lid 14*a* including AlSiC may be a good match for a package base 12*a* including alumina, because the CTEs may be approximately the same.

Figure 3:
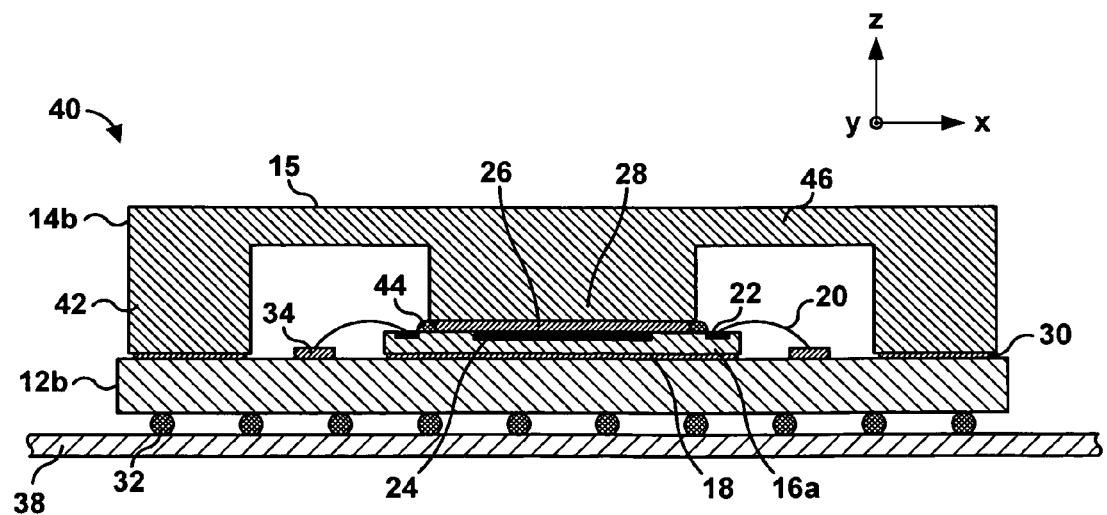
FIG. 3 is a cross-sectional diagram illustrating another example IC package including an electrically and thermally conductive package lid.

Although FIG. 1 illustrates a package base 12*a* including sidewalls 36 on which package lid 14*a* rests, other configurations of a package base and package lid are contemplated. For example, FIG. 3 illustrates an IC package 40 including a package base 12*b* that is substantially planar. IC package 40 may include a package lid 14*b* that comprises walls 42 that extend in a substantially z-axis direction from base 46 proximate to an outer perimeter of package lid 14*b*. Walls 42 of package lid 14*b* extend sufficiently far in the z-axis direction to rest on package base 12*b* and allow formation of a seal with package base 12*b* via sealing material 30. Walls 42 and mesa portion 28 of package lid 14*b* are sized relative to each other such that mesa portion 28 can be positioned proximate to top surface 17 of IC 16*a* when walls 42 are sealed to package base 12*b*.

FIG. 3 also illustrates a dam 44 of electrically insulative material, which may be applied to top surface 17 of IC 16*a* to substantially contain interface material 26 within the dam 44 and substantially prevent interface material 26 from contacting conductive pads 22. In some embodiments, dam 44 may comprise a nonconductive polymer. Dam 44 may be sized to prevent interface material 26 for flowing between a top of dam 44 and mesa portion 28 when package lid 14b is sealed to package base 12b. In this way, dam 44 may help prevent an inadvertent electrical connection between lid 14b and one or more of conductive pads 22, which may be undesirable if lid 14b acts as a ground, power, or signal route for circuitry of IC 16a.

Figure 4:
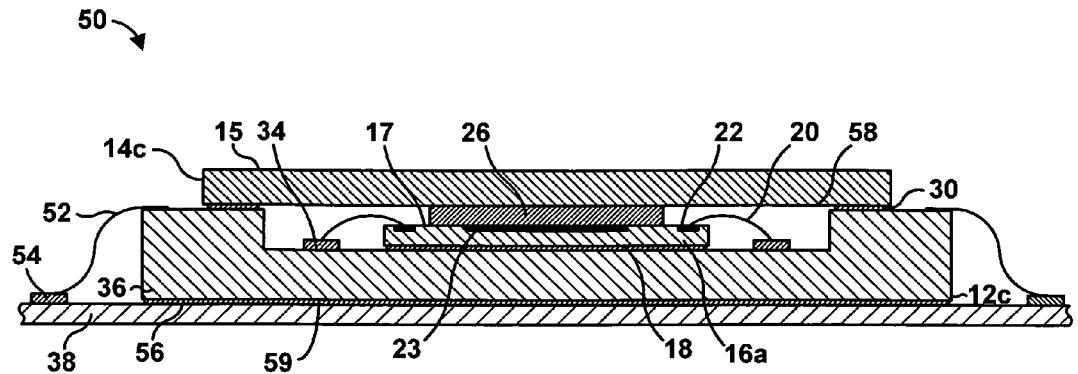
FIG. 4 is a cross-sectional diagram illustrating another example IC package including an electrically and thermally conductive package lid.

In some embodiments, a package lid may not include a mesa portion 28. For example, as shown in FIG. 4, package lid 14c may be substantially planar and may not include a mesa portion 28. In such embodiments, sidewalls of 36 of package base 12c (or walls 42 of a package lid 14b, see FIG. 3) may be sized to position a lower surface 58 of package lid 14c proximate to top surface 17 of IC 16a, without lower surface 58 contacting wires 20. Thermal contact between package lid 14c and IC 16a may be accomplished by applying an interface material 26 between top surface 17 of IC 16a and lower surface 58 of package lid 14c. As previously indicated, interface material 26 may include, for example, an electrically conductive material having a high thermal conductivity. For example, interface material 26 may include a polymer filled with conductive metal or ceramic particles. The interface material 26 may be provided as a gel, paste, or perform. In some embodiments, interface material 26 may be disposed within a dam 44 (FIG. 3), which may prevent the interface material 26 from contacting conductive pads 22.

FIG. 4 also illustrates IC package 50 being electrically connected to conductive circuit traces 54 on PWB 38 via perimeter leads 52. In some embodiments, package base 12c may be mechanically connected to PWB 38 by adhesive 56. In other embodiments, IC package 50 may electrically and mechanically connected to PWB 38 via a plurality of solder balls (e.g., solder balls 32 shown in FIGS. 1 and 3) on the bottom surface of package base 12c, a plurality of pins on the bottom surface of package base 12c, or a plurality of solder columns on the bottom surface of package base 12c.

Figure 5:
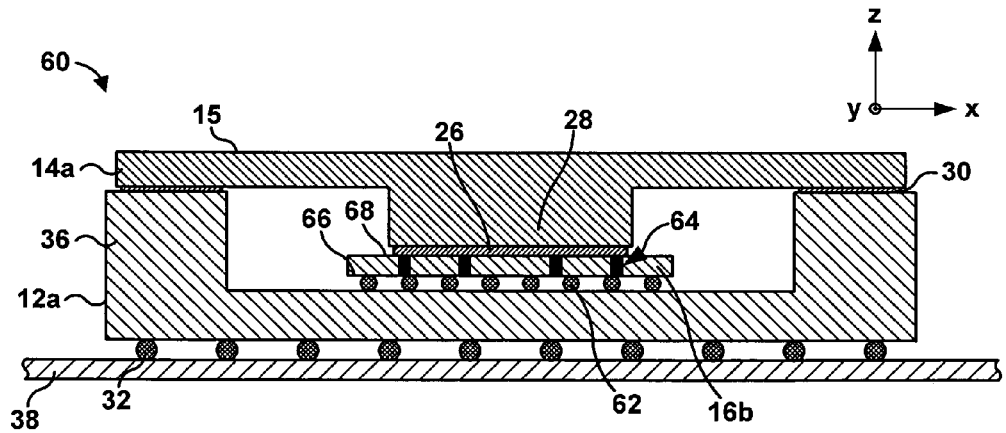
FIG. 5 is a cross-sectional diagram illustrating an example IC package including an electrically and thermally conductive package lid, which encloses a flip chip IC.

As described briefly above, in some embodiments, an IC may be attached to an IC package in a flip-chip configuration. FIG. 5 is a cross-sectional diagram illustrating an example of such a configuration. IC package 60 includes a flip-chip IC 16b electrically connected to package base 12a by a plurality of solder balls 62 adjacent bottom surface 66 of IC 16b. In other embodiments, an electrical connection between flip-chip IC 16b and package base 12a may be made through a plurality of conductive pillars disposed along the top surface of package base 12a or bottom surface 66 of flip-chip IC 16b or a plurality of solder columns disposed between bottom surface 66 of flip-chip IC 16b and package base 12a. In flip-chip IC 16b, the circuitry of the IC 16b is disposed proximate to or on bottom surface 66. Bottom surface 66 of IC 16b may define a plurality of conductive pads for connection to circuitry of IC 16b. In some embodiments, the conductive pads may be arranged similarly to conductive pads 22 of IC 16b (FIG. 2A), while in other embodiments, the conductive pads may have any suitable arrangement and are not necessarily arranged around an outer perimeter of IC 16b.

Flip-chip IC 16b may include a plurality of through silicon vias (TSVs) 64 that electrically connect the circuitry in IC 16b to a top surface 68 of IC 16b. The TSVs 64 may be formed during manufacture of flip-chip IC 16b by etching vias through IC 16b and filling the vias with a conductive material, such as an electroplated Cu or the like. TSVs 64 may allow use of electrically and thermally conductive package lid 14a and interface material 26 as a path to connect circuitry in flip-chip IC 16b to electrical ground, a power source, or an electrical signal route, similar to the above description with reference to FIGS. 1-4.

Figure 6:
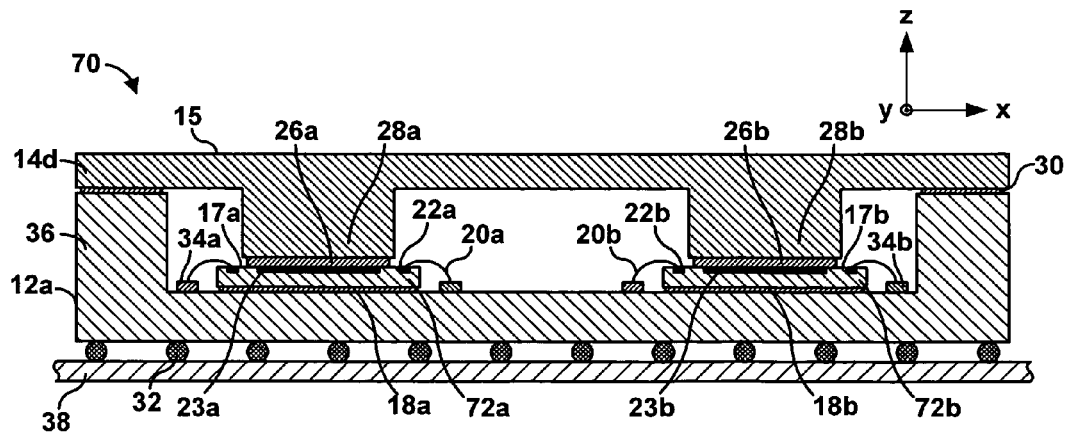
FIG. 6 is a cross-sectional diagram illustrating an example IC package including an electrically and thermally conductive package lid, which encloses two ICs.

In some embodiments, an IC package may include more than one IC disposed on a common horizontal plane (e.g., along the x-y plane shown in FIG. 6) within the IC package, e.g., disposed on package base 12a. For example, FIG. 6 is a cross-sectional diagram that illustrates an IC package 70 that encloses a first IC 72a and a second IC 72b. First IC 72a and second IC 72b may be substantially identically in some embodiments, while in other embodiments, first IC 72a may be different than second IC 72b. For example, first IC 72a and second IC 72b may each be wire-bonded IC (e.g., similar to IC 16a shown in FIG. 1) or flip-chips (e.g., similar to IC 16b shown in FIG. 5). As another example, first IC 72a may be a wire-bonded IC and second IC 72b may be a flip-chip, or first IC 72a may be a flip-chip and second IC 72b may be a wire-bonded IC. Although two ICs 72a, 72b disposed on a common plane of package base 12a are shown in FIG. 6, in other examples, an IC package may include more than two ICs disposed on a common plane, which can be on a surface other than a surface of package base 12a.

In the embodiment illustrated in FIG. 6, first IC 72a includes a first plurality of conductive pads 22a that are wire-bonded to a first set of conductive pads and/or traces 34a on package base 12a by a first plurality of wires 20a. First IC 72a also includes a first central conductive portion or pad 23a formed in a top surface 17a of first IC 72a. Similarly, second IC 72b includes a second plurality of conductive pads 22b that are wire-bonded to a second set of conductive pads and/or traces 34b on package base 12a by a second plurality of wires 20b. Second IC 72b also includes a second central conductive portion or pad 23b formed in a top surface 17b of second IC 72b. In some examples, first IC 72a and/or second IC 72b may include a plurality of central conductive pads, e.g., as shown with respect to IC 16a in FIG. 2B, rather than the single central conductive pads 23a, 23b, respectively, shown in FIG. 6.

In FIG. 6, as well as many of the other figures, features that are like-numbered with features shown in FIGS. 1A-2B may be similar. For example, conductive pads 22a, 22b may be similar to conductive pad 22 of IC 16a (FIGS. 1-2B), and conductive pads 23a, 23b may be similar to conductive pad 23 (FIG. 2A) or array 25 of conductive pads 24 (FIG. 2B) of IC 16a. Similarly, traces 34a, 34b are similar to traces 34 of IC 16a.

IC package 70 also includes a package lid 14d that comprises a first mesa portion 28a and a second mesa portion 28b. First mesa portion 28a and second mesa portion 28b are configured similarly to mesa portion 28 of lid 14a (FIG. 1). In the embodiment shown in FIG. 6, mesa portions 28a, 28b are positioned relative to first IC 72a and second IC 72b, such that mesa portions 28a, 28b extend towards top surface 17a of first IC 72a and top surface 17b of second IC 72b, respectively. In this way, first mesa portion 28a and first interface material 26a provide thermal and electrical communication between package lid 14d and first IC 72a, and second mesa portion 28b and second interface material 26b provide thermal and electrical communication between second IC 72b and package lid 14d.

In some embodiments, first central conductive portion 23a (also referred to as a conductive pad) and second central conductive portion 23b each may be connected to electrical ground or a common reference voltage through package lid 14d. In other embodiments, such as when package lid is constructed as a substantially electrically insulative substrate with a plurality of conductive vias, as described with reference to FIGS. 9 and 10, first central conductive portion 23a may be connected to a first electrical ground, reference voltage, or signal route, and second central conductive portion 23b may be connected to a second electrical ground, reference voltage, or signal route that is different than the first electrical ground, reference voltage or signal route.

Figure 7:
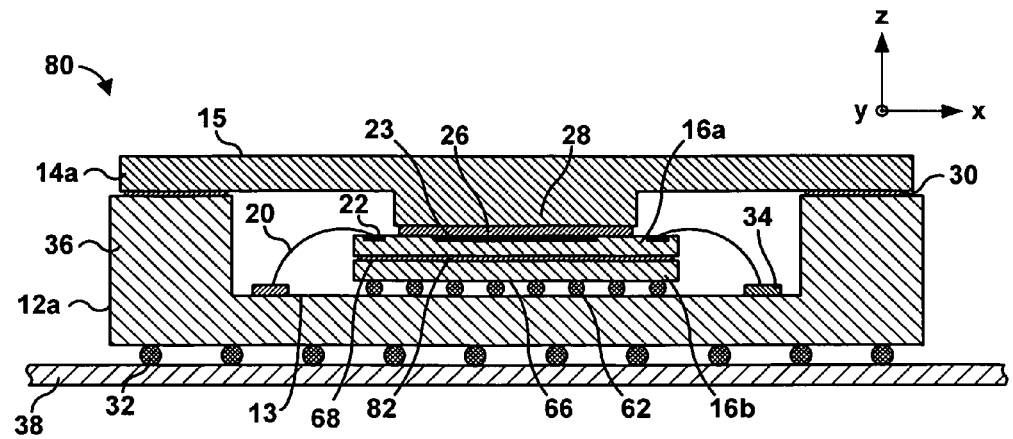
FIG. 7 is a cross-sectional diagram illustrating an example IC package including an electrically and thermally conductive package lid, which encloses two vertically stacked ICs.

In other embodiments, instead of including a plurality of ICs disposed within IC package 70 on a common horizontal plane, an IC package including a thermally and electrically conductive lid may include at least two ICs stacked vertically, one on top of the other. FIG. 7 is a cross-sectional diagram that illustrates an example IC package 80 that encloses a flip-chip IC 16b disposed on package base 12a and a wire-bonded IC 16a disposed over flip-chip IC 16b. In some embodiments, an example IC package 80 may include a wire-bonded IC 16a disposed on package base 12a and a flip-chip IC 16b disposed on wire-bonded IC 16a. Although not illustrated in the figures, in some embodiments an IC package 80 may include more than two ICs disposed one on top of another. For example, an IC package 80 may include up to eight ICs stacked vertically.

FIG. 7 illustrates flip-chip IC 16b electrically coupled to package base 12b by a plurality of solder balls 62. As described above with reference to FIG. 5, in other examples, flip-chip IC 16b may be electrically coupled to package base 12b by a plurality of conductive columns disposed along the top surface of package base 12a or bottom surface 66 of flip-chip IC 16b or by a plurality of solder columns disposed between bottom surface 66 of flip-chip IC 16b and package base 12a. In flip-chip IC 16b, the circuitry of the IC 16b is disposed proximate to or on bottom surface 66. In other embodiments, the bottom IC (e.g., IC located closest to surface 13 of package base 12a) in IC package 80 may be a wire-bond IC 16a, which is electrically connected to conductive pads and/or traces 34 on package base 12a via wires, similar to wire-bond IC 16a illustrated in FIG. 7. In embodiments in which the bottom IC is a wire-bond IC 16a, the wires (e.g., wires 20) may connect to conductive pads (e.g., conductive pads 22) located on a perimeter of the IC.

Wire-bond IC 16a may be adhered or otherwise attached to flip-chip IC 16b by, for example, a layer of adhesive 82. Wires 20 electrically connect conductive pads 22 on IC 16a to conductive pads and/or traces 34 on package base 12a to provide electrical communication between IC 16a and package base 12a, and, ultimately, PWB 38 to which IC package 80 is electrically connected. Conductive pads 22 may electrically connect to circuitry within IC 16a or a ground plane in IC 16a.

IC 16a also includes a central conductive portion 23 formed in a top surface 17 of IC 16a, which is in electrical communication with mesa portion 28 of electrically and thermally conductive package lid 14a via interface material 26. As described above, central conductive portion 23 may connect to a ground plane, power plane, or signal route in IC 16a and may provide an additional electrical connection to the ground plane, power plane, or signal route through package lid 14a.

Figure 8:
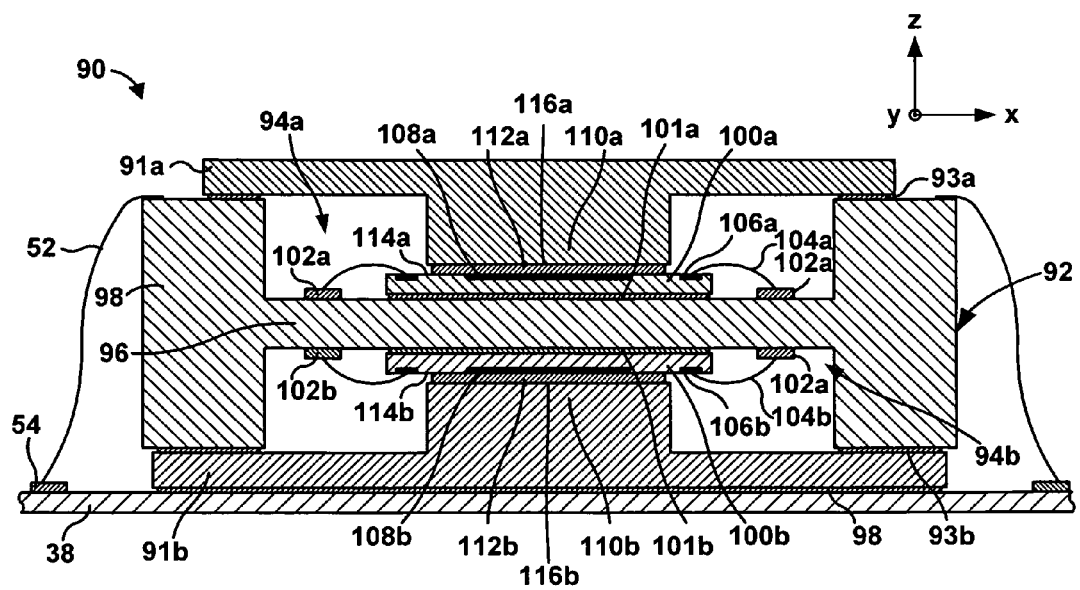
FIG. 8 is a cross-sectional diagram illustrating an example double-sided IC package including two electrically and thermally conductive package lids.

In other embodiments, a thermally and electrically conductive package lid may be utilized with a double-sided IC package. FIG. 8 is a cross-sectional diagram that illustrates an example double-sided IC package 90 that includes electrically and thermally conductive package lids 91a, 91b and package base 92 that defines a first cavity 94a and a second cavity 94b. Package lids 91a, 91b are connected to package base 92 using any suitable technique. In the example IC package 90 shown in FIG. 8, package lids 91a, 91b are mechanically attached to package base 92 with the aid of sealing material 93a, 93b, respectively, which is positioned between the respective package lid 91a, 91b and package base 92. Sealing material 93a, 93b can be similar to sealing material 30 of IC package 10 shown in FIG. 1. In some examples, package lids 91a, 91b, package base 92, and sealing material 93a, 93b defines a hermetic IC package 90. However, in other examples, the IC package 90 is not hermetically sealed.

Package base 92 comprises a base portion 96 and sidewalls 98 that extend in the positive and negative z-axis directions substantially normal from base portion 96 proximate to the perimeter of base portion 96. Sidewalls 98 and base portion 96 define the first cavity 94a and second cavity 94b on either side of base portion 96.

Package cavities 94a, 94b may house one or more ICs and package base 92 may define conductive traces for electrically connecting the ICs to PWB 38. Double-sided IC package 90 may include one or more flip-chip ICs, one or more wire bonded ICs, or any combination thereof. In the embodiment illustrated in FIG. 8, a first IC 100a, which may be similar to IC 16a (FIG. 1), is disposed in first cavity 94a and a second IC 100b is disposed in second cavity 94b. ICs 100a, 100b may be mechanically connected to package base 92 using any suitable technique, such as with an adhesive 101a, 101b, respectively.

ICs 100a, 100b can be electrically connected to traces within package base 92 using respective wires. In the example shown in FIG. 8, first IC 100a and second IC 100b are wire-bonded to conductive pads and/or traces 102a and 102b, respectively, by wires 104a and 104b, respectively. In other embodiments, one or both of first IC 100a and second IC 100b may comprise a flip-chip IC (e.g., flip-chip IC 16b), and may be electrically connected to package base 12 via solder, conductive columns, and the like. Additionally or alternatively, in some embodiments more than one IC may be disposed in one or both of first cavity 94a and 94b.

First IC 100a includes a plurality of conductive pads 106a that are connected to circuitry within first IC 100a and are connected to conductive pads and/or traces 102a of package base 92 by wires 104a. First IC 100a also includes a central conductive portion 108a (also referred to as a conductive pad) that is in electrical communication with mesa portion 110a of first package lid 91a via interface material 112a. In the example shown in FIG. 8, interface material 112a is positioned between a top surface 114a of IC 110a and a bottom surface 116a of mesa portion 110a. As with interface material 26, interface material 112a includes a thermally and electrically conductive material, such that interface material 112a helps improve heat conduction from IC 100a into package lid 91a.

Similarly, second IC 100b includes a plurality of conductive pads 106b that are connected to circuitry within second IC 100b and are connected to conductive pads and/or traces 102b of package base 92 by wires 104b. Second IC 100b also includes a central conductive portion 108b also referred to as a conductive pad) that is in electrical communication with mesa portion 110b of second package lid 91b via interface material 112b. Interface material 112b includes a thermally and electrically conductive material, and helps improve heat conduction from IC 100b into package lid 91b. Conductive pads 106a, 106b may be similar to conductive pads 22 of IC 16a (FIGS. 1 and 2A), which are arranged along an outer perimeter of the IC. In addition, central conductive portions 108a, 108b may be similar to central conduction portion 23 of IC 16a (FIG. 2A) or may include an array 25 of conductive portions 24 (FIG. 2B).

Second package lid 91b may be adhered or otherwise attached to PWB 38 by an adhesive 98. In addition, electrically conductive vias (not shown) within package base 92 may be electrically connected to conductive circuit traces 54 on PWB 38 via perimeter leads 52. The electrically conductive vias in package base 92 may be connected to conductive traces and/or pads 102a and/or 102b to provide electrical communication between first IC 100a and PWB 38 and second IC 100b and PWB 38. In addition, in some embodiments, as described below with respect to FIG. 10, electrical vias in package base 92 may provide an electrical pathway from first package lid 91a and/or second package lid 91b through package base 92 and perimeter leads 52, and to PWB 38.

Figure 9:
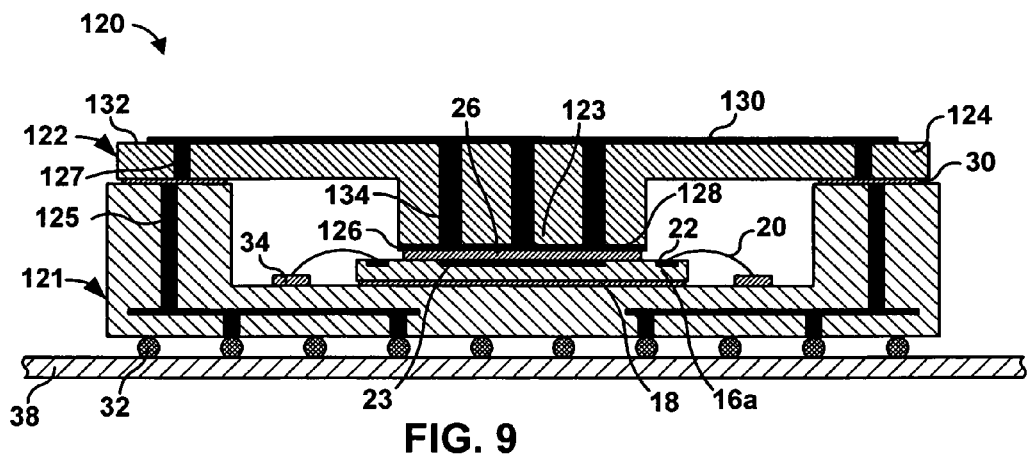
FIG. 9 is a cross-sectional diagram illustrating an example IC package including a package lid comprising a substantially electrically nonconductive substrate, metal layers applied to a respective one of the first and second surfaces of the substrate, and electrically conductive vias connecting the metal layer applied to the first surface and the metal layer applied to the second surface.

While the embodiments described above are directed to a package lid (e.g., 14a in FIG. 1 or package lids 91a, 91b in FIG. 8) comprising a thermally and electrically conductive material, e.g., defining a single layer of the same material, in other embodiments a package lid may be partially electrically conductive, whereby the electrically conductive portions are arranged to act as a ground connection, power connection, or signal route for one or more ICs. FIG. 9 illustrates an IC package that includes a package lid including a multilayer structure. In particular, FIG. 9 is a schematic cross-sectional illustration of IC package 120, which includes package base 121 including conductive vias 125 and multilayer package lid 122 defining mesa portion 123. IC package 120 electrically connects IC 16a to PWB 38.

In the example shown in FIG. 9, package lid 122 has a multilayer structure, whereby at least some of the layers are more electrically conductive than other layers. For example, package lid 122 may include a substrate 124 comprising a thermally conductive, but substantially electrically insulative material. In general, substrate 124 may comprise a substantially electrically insulative material having a thermal conductivity greater than approximately 50 W/mK. In some embodiments, substrate 124 may comprise a substantially electrically insulative material having a thermal conductivity greater than approximately 150 W/mK. Suitable materials for substrate 124 include, for example, AlN, which may have a thermal conductivity of between approximately 170 W/mK and 200 W/mK, SiC, which may have a thermal conductivity of between approximately 200 W/mK and 270 W/mK, or the like. In other embodiments, substrate 124 may comprise alumina, which may have a thermal conductivity lower than 50 W/mK (e.g., approximately 14 W/mK).

Substrate 124 may be coated with a first metal layer 126 on at least a portion of a bottom surface 128 of lid 122 (which is defined by mesa portion 123 in the example shown in FIG. 9) and a second metal layer 130 on at least a portion of a top surface 132 of package lid 122. First and second metal layers 126 and 130 may be deposited on bottom surface 128 and top surface 132, respectively, of lid 122 by, for example, sputtering, physical vapor deposition, screen printing, or the like. Substrate 124 and first and second metal layers 126, 130 may then be heat treated (e.g., fired) to fuse metal layers 126, 130 to substrate 124. In some embodiments, an additional coating of, for example, Ni/Au may be deposited or formed on one or both of the metal layers 126 and 130. The Ni/Au coating may protect the underlying metal coatings 126 and 130 from oxidation or corrosion, and may facilitate soldering or wire bonding.

Package lid 122 may further include a plurality of electrically conductive vias 134 that extend through mesa portion 123 and electrically connect first metal layer 126 and second metal layer 130. Vias 134 may comprise, for example, doped portions of substrate 124, which may result in vias 134 being more electrically conductive than substrate 62. For example, SiC may be doped with Al to increase the electrically conductivity of SiC. In other embodiments, vias 134 may comprise a metal or other conductive material that has been deposited in openings defined in substrate 124 between bottom surface 128 and top surface 132. For example, the openings may be formed in substrate 124 by chemical etching or mechanical removal of material from substrate 124. The openings may then be filled with conductive material, such as a metal, to form vias 134. In some embodiments, the openings may be filled with conductive material and then fired to fuse the conductive material forming the vias 134 to the substrate 124. While three vias 134 are shown in FIG. 9, in other embodiments, package lid 122 may include any suitable number of electrically conductive vias, such as more than three vias 134 or less than three vias. For example, package lid 122 may include a single via 134 electrically connecting first metal layer 126 and second metal layer 130.

First and second metal layers 126 and 130 and vias 134 may be used to make electrical connection between central conductive pad 23 of IC 16a and ground, between central conductive pad 23 and an electrical power source, or between central conductive pad 23 and a signal route, similar to package lid 14a described with reference to FIG. 1. More specifically, interface material 26 may comprise an electrically and thermally conductive material, and may allow electrical current to be conducted between central conductive pad 23 of IC 16a and first metal layer 126.

While FIG. 9 illustrates a single central conductive pad 23, in some embodiments, IC 16a may include a plurality of central conductive pads (see, e.g., FIG. 2B). For example, each of the conductive pads may connect to or comprise a common or separate ground plane, power plane, or signal route in IC 16a. In any case, first and second metal layers 126, 130 and vias 134 may allow electrical connection to IC 16a through package lid 122.

In some embodiments, package lid 122 may include at least one via 127 that provides an electrically conductive pathway to package base 121 through an electrically conductive sealing material 30. Electrically conductive via 127 may be formed by a similar method to vias 134. Electrical current may be conducted through vias 134 to second metal layer 130 and vias 127 to sealing material 30. The electrical current may then flow through electrically conductive vias 125 formed in package base 121 and to solder balls 32, which connect to circuitry in PWB 38. In this way, central conductive pad 23 may be electrically connected to circuitry in PWB 38 through package lid 122 and package base 121.

Figure 10:
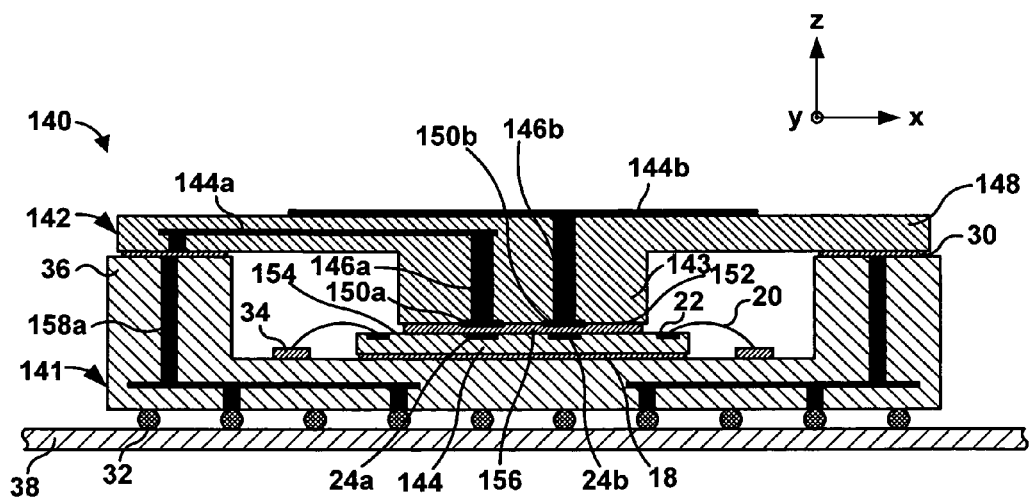
FIG. 10 is a cross-sectional diagram illustrating another example IC package including a package lid comprising a substantially electrically nonconductive substrate, a metal layer applied to a first surface of the package lid, and electrically conductive vias connecting the metal layer applied to the first surface to a printed wire board on which the IC is mounted.

In some embodiments, as illustrated in FIG. 10, a package lid 142 may be used to make a plurality of separate electrical connections to an IC 144. FIG. 10 is a cross-sectional illustration of IC package 140, which includes package base 141, package lid 142 that defines mesa 143, and IC 144. In the example shown in FIG. 10, IC 144 may include a plurality of central conductive pads, such as a first central conductive pad 24a and a second central conductive pad 24b. In some embodiments, first central conductive pad 24a may be electrically connected to a first circuitry in IC 144 and second central conductive pad 24b may be electrically connected to a second circuitry in IC 144 where the first and second circuitries may or may not be electrically connected (e.g., a ground plane, power plane, or signal route). As one example, first central conductive pad 24a may be electrically connected to a ground plane in IC 144 while second central conductive pad 24b may be electrically connected to a power plane or a signal route in IC 144.

Figure 11:
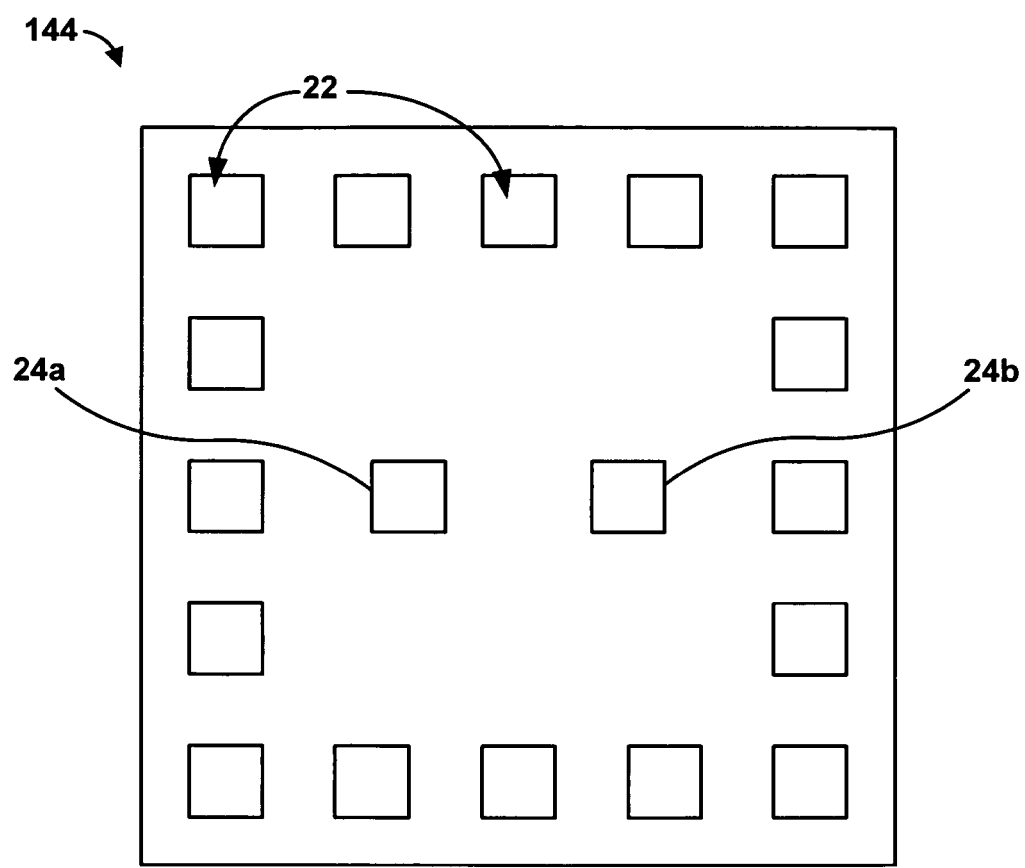
FIG. 11 is a conceptual diagram illustrating an example IC including a plurality of apertures formed in a passivation layer to expose a plurality of conductive pads.

Other configurations of the electrical connection between conductive pads 24a, 24b are also possible. For example, first central conductive pad 24a may be connected to a signal route in IC 144 at a first location to provide input and/or output of signals from a first portion of circuitry and second central conductive pad 24b may be connected to the same signal route in IC 144 at a second location to provide input and/or output of signals from a second portion of circuitry. FIG. 11 illustrates a conceptual diagram of a top view of IC 144 and illustrates an example of relative locations of conductive pads 22, first central conductive pad 24a and second central conductive pad 24b. While FIG. 11 shows sixteen conductive pads 22 and two central conductive pads 24a and 24b, in other embodiments, IC 144 may include a greater or fewer number of conductive pads 22 and/or central conductive pads 24a and 24b.

In the example shown in FIG. 10, package lid 142 includes a first electrically conductive pathway including first metal portion 144a and first electrically conductive via 146a to permit electrical communication between first central conductive pad 24a and a first external circuit. Package lid 142 also defines a second electrically conductive pathway including second metal portion 144b and second electrically conductive via 146b to permit electrical communication between second central conductive pad 24b and a second external circuit. In the example illustrated in FIG. 10, the electrically conductive pathway including conductive pad 24a is electrically isolated from the electrically conductive pathway including conductive pad 24b. However, in some examples, electrically conductive pathways including conductive pad 24a and conductive pad 24b may be a part of a common electrical circuit.

The first and second electrically conductive pathways may be formed in or on lid 142 using any suitable technique. For example, package lid 142 may be formed as a multilayer structure including a substrate 148 (which may be similar to substrate 124 of FIG. 9) and a more electrically conductive material, which forms electrically conductive planes 144a, 144b. In some embodiments, the more electrically conductive material may be deposited in a layer on a partially formed substrate 148 and fired to bond the more conductive material to substrate 148 to form planes 144a, 144b. In other embodiments, substrate 148 may be formed and then etched or machined to form channels or openings into which a more electrically conductive material is deposited. The structure may then be fired to bond the more conductive material to substrate 148 and form planes 144a, 144b.

Package lid 142 also includes a conductive portion on bottom surface 152 of package lid 142. In the example shown in FIG. 10, conductive portion on the bottom surface 152 of lid 142 is defined by first and second metal layers 150a, 150b. In other examples, another type of conductive material or a combination of materials may be used to define conductive portions 150a, 150b of lid 142. First metal layer 150a is electrically connected to first electrically conductive plane 144a by a first electrically conductive via 146a and second metal layer 150b is electrically connected to second electrically conductive plane 144b by a second electrically conductive via 146b. In addition, first metal layer 150a may be disposed proximate to first central conductive pad 24a and second metal layer 150b may be disposed proximate to second central conductive pad 24b.

Just as with first metal layer 126 and second metal layer 130 described with reference to FIG. 9, first metal layer 150a and second metal layer 150b may be deposited on bottom surface 152 of lid 142 by, for example, sputtering, physical vapor deposition, screen printing, or the like. The substrate 148 and first metal layers 150a, 150b may then be heat treated (e.g., fired) to fuse the metal layers 150a, 150b to the substrate 148. In some embodiments, an additional coating of, for example, Ni/Au may be deposited or formed on first metal layer 150a and second metal layer 150b. The Ni/Au coating may protect the underlying first metal layer 150a from oxidation or corrosion, and may facilitate soldering or wire bonding.

First electrically conductive via 146a and second electrically conductive via 146b (collectively referred to as "vias 146") may comprise, for example, doped portions of substrate 148, which result in vias 146 being more electrically conductive than substrate 148. For example, SiC may be doped with Al to increase the electrically conductivity of the SiC. In other embodiments, vias 146 may comprise a metal or other conductive material that has been deposited in openings defined in substrate 148. For example, the openings may be formed in substrate 148 by chemical etching or mechanical removal of material from substrate 148. The openings may then be filled with conductive material, such as a Cu, W, Mo, or the like, to form vias 148.

In some embodiments, electrical connection between first central conductive pad 24a and first patterned metal layer 150a, and between second central conductive pad 24b and second patterned metal layer 150b may be made by direct physical contact between first central conductive pad 24a and first metal layer 150a, and second central conductive pad 24b and second metal layer 150b, respectively. For example, at least one of first metal layer 150a and second metal layer 150b may comprise gold or another relatively malleable, conductive material. The first metal layer 150a and/or second metal layer 150b may then deform when pressure is applied between package lid 142 and top surface 154 of IC 144. In other embodiments, at least one of first metal layer 150a and second metal layer 150b may comprise a protrusion that facilitates close physical contact with first central conductive portion 24a or second central conductive portion 24b, respectively. In other embodiments, as illustrated in FIG. 10, electrical connection between first central conductive pad 24a and first portion 150a and second central conductive pad 24b and second portion 150b may be made through an electrically conductive interface material 156.

In some embodiments, electrically conductive interface material 156 may comprise an anisotropically electrically conductive material. That is, interface material 156 may be more electrically conductive in a first direction than in a second direction. For example, interface material 156 may be more highly electrically conductive along the z-axis direction of FIG. 10 than along the x and/or y-axis directions of FIG. 10. Such anisotropic conductivity may be accomplished by, for example, utilizing an interface material 156 that includes a substantially electrically insulative matrix and an electrically conductive filler material that is disposed so as to conduct more readily in a first direction than a second direction. For example, the matrix material may include a substantially electrically insulative polymer. The electrically conductive filler material may include, for example, metal or ceramic filaments or wires that extend substantially in a single direction, a plurality of electrically conductive particles that may be forced into contact along one axis through application of pressure to interface material 156, or the like. Use of an anisotropically electrically conductive interface material 156 may mitigate the risk of generating an electrical short, e.g., an electrical connection between first central conductive pad 24a and second central conductive pad 24b, between first metal layer 150a and second metal layer 150b, or the like.

First electrically conductive plane 144a may be configured to communicate electrical signals from IC 144 through first electrically conductive via 146a to electrically conductive traces or vias 158a in package base 141. Electrically conductive traces or vias 158a in package base 141 then communicate the electrical signals to PWB 38 through one or more of solder balls 32. In this way, first central conductive portion 24*a* may be in electrical communication with PWB 38 through package lid 142 and package base 141.

Second electrically conductive plane 144*b* may be configured to communicate electrical signals from IC 144 through second electrically conductive via 146*b* to a circuit connection outside of IC package 140. For example, a package lead may electrically connect second electrically conductive plane 144*b* to circuitry in PWB 38. In other examples, second electrically conductive plane 144*b* may be connected to another component to provide a ground for IC 144.

An IC 144 and package cover 142 as described with respect to FIG. 10 may allow additional electrical connections to be made to IC 144 through package lid 142 compared to package lids 14*a* (FIG. 1), 14*b* (FIG. 3), 14*c* (FIG. 4), 14*d* (FIG. 6), and lid 122 (FIG. 9), which only provide a single electrically conductive portion for connection to the respective IC 16. In addition, package cover 142 including a plurality of distinct conductive pathways from bottom surface 152 may allow connection of different central conductive pads to different voltage potentials or signal routes.

For example, first central conductive pad 24*a* may be connected to ground via first metal layer 150*a*, first electrically conductive via 146*a*, and first electrically conductive plane 144*a*, while second central conductive pad 24*b* may be connected to a different reference potential via second metal layer 150*b*, second via 146*b*, and second electrically conductive plane 144*b*. Substrate 148 electrically isolates the conductive path including first metal layer 150*a*, first electrically conductive via 146*a*, and first conductive plane 144*a* from the electrically conductive path including second metal layer 150*b*, second conductive via 146*b*, and second conductive plane 144*b*. In this way, package lid 142 and IC 144 including multiple central conductive pads 24*a*, 24*b* may increase the number of voltage potentials electrical signal routes to which IC 144 may be connected.

While FIG. 10 illustrates first and second central conductive pads 24*a* and 24*b*, in other embodiments an IC 144 may include a greater number of central conductive pads 24. The number of central conductive pads may only be limited by a minimum size of the conductive pads 24 and an area of top surface 154 of IC 144.

Figure 12:
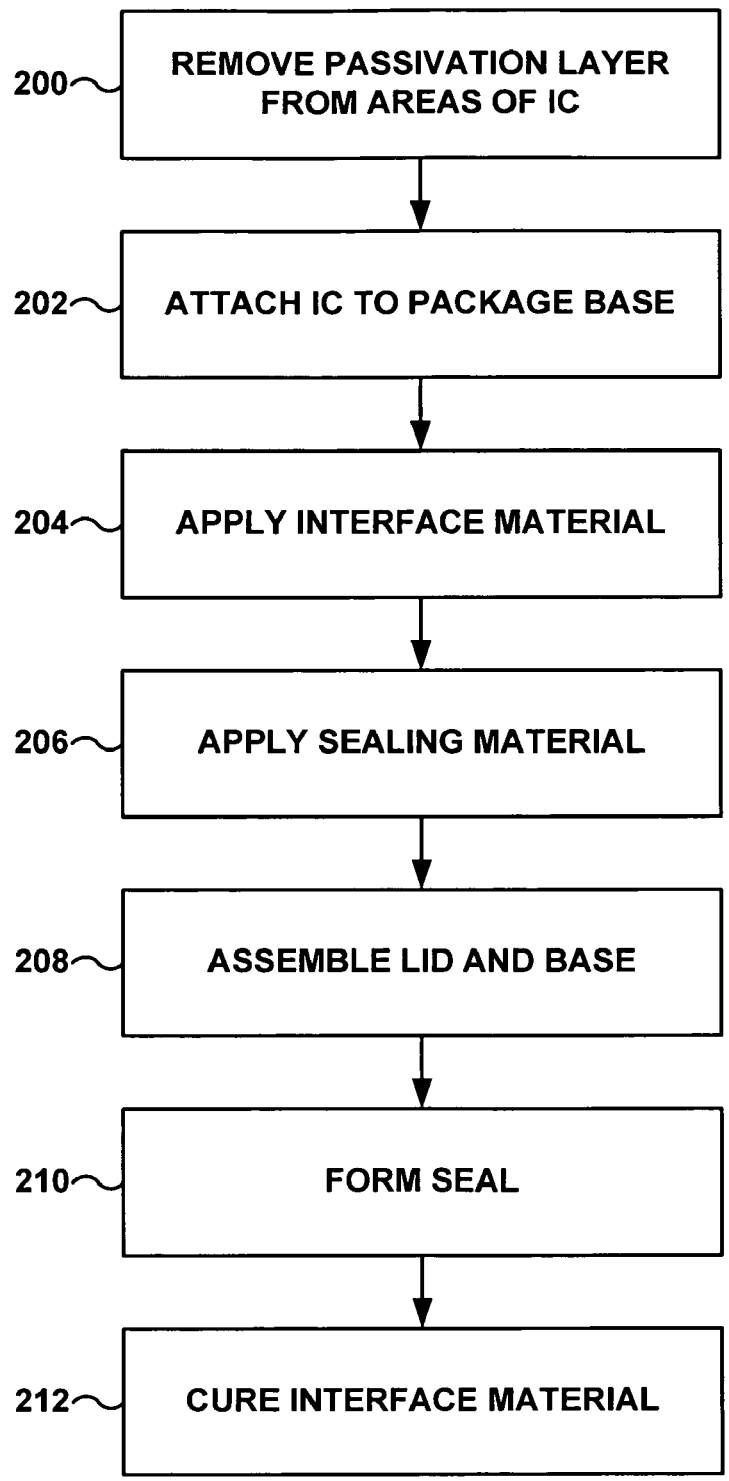
FIG. 12 is a flow diagram illustrating an example technique of manufacturing an IC package including an electrically and thermally conductive package lid.

FIG. 12 is a flow diagram illustrating an example method of forming an IC package, which will be described with concurrent reference to IC package 10 of FIG. 1. Although FIG. 12 is described with reference to IC package 10, the technique of FIG. 12 may be adapted to be utilized in production of other IC packages, including, for example, IC packages 40 (FIG. 3), 50, (FIG. 4), 60 (FIG. 5), 70 (FIG. 6), 80 (FIG. 7), 90 (FIG. 8), 120 (FIG. 9), or 140 (FIG. 10).

Initially, IC 16*a* including a passivation layer formed over circuitry on a top surface 17 of the IC 16*a* is produced. The passivation layer is removed from portions of top surface 17 of IC 16*a* in a pattern corresponding to conductive pads 22 and at least one central conductive pad 23 or 24 (200). The passivation layer may be removed to define conductive pads 22, 23 (or a plurality of central conductive pads 24) by, for example, chemical etching, although any suitable technique may be used. As described with respect to FIGS. 2B, 10, and 11, in some embodiments, an IC 16*a* or 144 may include a plurality of central conductive pads 24. Removal of the passivation layer to define conductive pads 22 and one or more central conductive pads 23 and/or 24 may be performed at the silicon wafer level. Once the conductive pads 22 and one or more central conductive pads are defined, the wafer may be singulated to define a plurality of separate ICs, (e.g., IC 16*a*). The following processes then may be performed on an individual IC 16*a*.

IC 16*a* may then be mechanically and/or electrically coupled or attached to package base 12*a* (202). In some embodiments, IC 16*a* may be mechanically coupled to package base 12*a* by a layer of adhesive 18. Adhesive 18 may be applied to IC 16*a* and IC 16*a* placed on package base 12*a* and/or adhesive 18 may be applied to package base 12*a* and IC 16*a* placed on the layer of adhesive 18.

IC 16*a* may also be electrically coupled to package base 12*a*. More particularly, conductive pads 22 may be wire bonded to corresponding conductive traces 34 on package base 12*a* using a plurality of wires 20. Each of wires 20 may be bonded to one of conductive pads 22 and one of conductive traces 34 to form an electrical connection between conductive traces 34 and conductive pads 22. The electrical connection may be used to communicate signals to and from circuitry in IC 16*a*, or may be used to connect IC 16*a* to ground or power potentials. In other embodiments, a flip-chip IC 16*b* (FIG. 5) may be utilized, and may be connected to conductive traces in package base 12*a* via solder balls 62, solder columns, or electrically conductive columns.

Once IC 16*a* has been connected to package base 12*a*, interface material 26 may be applied to top surface 17 of IC 16*a* (204). As described above, interface material 26 may be both electrically and thermally conductive, and may be used to make electrical and thermal connection between IC 16*a* and package lid 14*a*. For example, interface material 26 may comprise a polymer gel, paste, or tape, filled with conductive particles, such metal or an electrically conductive ceramic. In some embodiments, interface material may comprise an anisotropically conductive material, e.g., a material that is more conductive in a first direction than in a second direction (see FIG. 10, electrically conductive interface material 119).

Interface material 26 may be applied to top surface 17 of IC 16*a* so that material 26 substantially covers central conductive pad 24 and does not cover or contact conductive pads 22 and/or wires 20. In this way, interface material 26 may be arranged such that interface material 26 does not electrically connect central conductive pad 24 and one or more of conductive pads 22, and such that interface material 26 does not electrically connect conductive pads 22 to each other. In some embodiments, prior to applying interface material 26, dam 44 comprising an electrically insulative material may be formed on top surface 17 to help contain interface material 26 within a predefined area and prevent interface material 26 from contacting conductive pads 22 and/or wires 20. In other embodiments, interface material 26 may be applied to a bottom surface of mesa portion 28 or lid 14*a*.

The technique may further include applying sealing material 30 to package base 12*a* or package lid 14*a* (206). In some embodiments, sealing material 30 may be applied to a predefined area proximate to a perimeter of package lid 14*a*, while in other embodiments sealing material 30 may be applied to the top of walls 36 of package base 12*a*. Regardless of whether sealing material 30 is applied to package lid 14*a* and/or package base 12*a*, sealing material 30 may be disposed such that sealing material 30 forms a seal between package lid 14*a* and package base 12*a* when package lid 14*a* is assembled with package base 12*a*. In this way, sealing material 30 mechanically connects package lid 14*a* and package base 12*a*.

Sealing material 30 may comprise, for example, gold-tin (AuSn), gold-germanium (AuGe), tin-lead (SnPb), metal filled glasses, or lead free solder (e.g., tin-silver-copper alloys), and may seal the lid 14*a* to the base 12*a* to form a hermetic package. Alternatively, non-hermetic packages may be sealed with polymeric adhesives filled with thermally conductive particles such as silver, gold, AlN, SiC, or diamond. In either case, sealing material 30 may be thermally conductive and may allow heat to flow between package base 12a and package lid 14a.

In examples in which sealing material 30 comprises a metal or metal alloy, one or both of package base 12a and package lid 14a may include a metallic layer applied to the surface and location at which sealing material 30 will contact base 12a or lid 14a. The metallic layer may be applied by, for example, sputtering, chemical vapor deposition, physical vapor deposition, or the like, and may be fired to fuse the metal layer to base 12a or lid 14a. The metallic layer may then be plated with Ni and Au. The resulting metal layer facilitates formation of a bond between sealing material 30 and package base 12a and/or package lid 14a.

Once the interface material 26 and sealing material 30 have been applied to IC package 10 (204), (206), package lid 14a is assembled with package base 12a (208). Package lid 14a may be disposed over package base 12a such that mesa portion 28 contacts interface material 26 and a perimeter portion of lid 14a rests on walls 36 of package base 12a. In embodiments in which a package lid 142 (FIG. 10) comprising a metal layer including a first portion 150a and a second portion 150b is used, package lid 142 may be positioned such that first portion 150a is substantially aligned with first central conductive pad 24a and second portion 150b is substantially aligned with second central conductive pad 24b.

Once package lid 14a and package base 12a have been assembled (208), a seal may be formed between lid 14a and base 12a by melting sealing material 30 and allowing material 30 to resolidify (210). In cases in which sealing material 30 comprises an alloy, this may be a solder reflow process. In cases in which sealing material 30 comprises a polymer, material 30 may be heated above its glass transition temperature or melting temperature and cooled to reform a solid.

In some embodiments, the technique may further include curing interface material 26 (212). For example, interface material 26 may comprise a phase change material or an epoxy that may be cured to form a highly cross-linked network, which resists flow. In some embodiments, interface material 26 may be cured substantially simultaneously with forming the seal (210). In other embodiments, interface material 26 may be cured prior to or after forming the seal (210). In some embodiments, interface material 26 may not need to be cured.

Although the disclosure has been directed to a number of individual embodiments, features and techniques described with respect to one embodiment may be used with features and techniques described with respect to another embodiment. That is, none of the features of the various embodiments are to be understood as mutually exclusive or incapable of being used together. To the contrary, features from one embodiment may be combined with features of another embodiment in a single device. For example, a dam 44 comprising an electrically insulative material may be used to contain interface material 26 in any embodiment. Similarly, features of package lid 14a, 14b, 14c, 14d, 14e, 91a, 91b, 122, and 142 may be used with IC 16a, 16b, 16c, 72a, 72b, 100a, 100b, and 144, and features of package lids described herein may be used in combination with each other. For example, a package lid 14a comprising an electrically and thermally conductive material may be used with an IC 144 (FIG. 10) including a plurality of central conductive pads (e.g., first central conductive pad 24a and second central conductive pad 24b). Other combinations of features and techniques described herein will be apparent to one of ordinary skill in the art, and are within the scope of the following claims.

Various embodiments have been described in the disclosure. These and other embodiments are within the scope of the following claims.

The invention claimed is:

1. A system comprising:
   a package base;
   an integrated circuit attached to the package base, wherein the integrated circuit comprises an electrically conductive layer and a passivation layer disposed over the electrically conductive layer, wherein the passivation layer defines a plurality of openings that expose the electrically conductive layer to define a plurality of electrically conductive portions; and
   an electrically and thermally conductive package lid in electrical communication with at least one of the plurality of electrically conductive portions of the integrated circuit, wherein the package lid is in thermal communication with the integrated circuit, and wherein the package base and the package lid form a hermetic seal around the integrated circuit.

2. The system of claim 1, wherein the electrically conductive layer comprises a ground plane layer.

3. The system of claim 1, wherein the electrically and thermally conductive package lid comprises a thermal conductivity greater than approximately 50 watts per meter-Kelvin.

4. The system of claim 1, wherein the electrically and thermally conductive package lid comprises at least one of aluminum silicon carbide (AlSiC), copper tungsten (CuW), or copper molybdenum (CuMo).

5. The system of claim 1, further comprising an electrically and thermally conductive interface material disposed between the integrated circuit and the electrically and thermally conductive package lid.

6. The system of claim 1, wherein the electrically and thermally conductive package lid comprises a mesa extending from a base of the electrically and thermally conductive package lid towards a surface of the integrated circuit.

7. The system of claim 1, wherein the plurality of electrically conductive portions comprise a first set of electrically conductive pads distributed around an outer perimeter of the passivation layer and at least one central electrically conductive portion surrounded by the first set of conductive pads.

8. The system of claim 1, wherein the integrated circuit comprises a flip-chip integrated circuit comprising a plurality of through silicon vias.

9. The system of claim 1, wherein the integrated circuit comprises a first integrated circuit, the system further comprising a second integrated circuit attached to the package base.

10. A system comprising:
    a package base;
    an integrated circuit attached to the package base, wherein the integrated circuit comprises an electrically conductive layer and a passivation layer, wherein the passivation layer defines a plurality of openings that expose the electrically conductive layer to define a plurality of electrically conductive portions; and
    a package lid comprising:
       a substantially electrically nonconductive substrate defining a surface,
       a metal layer applied to the surface of the substrate,
       an electrically conductive plane, and
       an electrically conductive via electrically connecting the metal layer and the electrically conductive plane, wherein the metal layer is electrically connected to at least one of the electrically conductive portions of the integrated circuit.

11. The system of claim 10, further comprising an electrically and thermally conductive interface material disposed between the at least one of the electrically conductive portions of the integrated circuit and the metal layer.

12. The system of claim 10, wherein the metal layer comprises a first portion and a second portion separated from the first portion, wherein the electrically conductive plane comprises a first electrically conductive plane and a second electrically conductive plane, and wherein the electrically conductive via comprises a first electrically conductive via electrically connecting the first portion and the first electrically conductive plane through the substantially electrically nonconductive substrate and a second electrically conductive via electrically connecting the second portion and the second electrically conductive plane through the substantially electrically nonconductive substrate.

13. The system of claim 12, further comprising an anisotropically electrically and thermally conductive interface material disposed between the first and second portions of the metal layer and respective electrically conductive portions of the integrated circuit.

14. The system of claim 12, wherein the passivation layer defines openings that expose the electrically conductive layer of the integrated circuit to define at least a first electrically conductive portion and a second electrically conductive portion separate from the first electrically conductive portion, and wherein the first portion of the metal layer is configured to be electrically connected to the first electrically conductive portion and the second portion of the metal layer is configured to be electrically connected to the second electrically conductive portion.

15. The system of claim 10, wherein the surface comprises a first surface, wherein the substantially electrically nonconductive substrate defines a second surface substantially opposite the first surface, and wherein the electrically conductive plane is disposed on the second surface of the substantially electrically nonconductive substrate.

16. The system of claim 10, wherein the package base comprises an electrically conductive package base via, and wherein the electrically conductive plane is in electrical communication with the electrically conductive package base via.

17. A method comprising:
attaching an integrated circuit to a package base, wherein the integrated circuit comprises an electrically conductive layer and a passivation layer disposed over the electrically conductive layer, wherein the passivation layer defines a plurality of openings that expose the electrically conductive layer to define a plurality of electrically conductive portions; and
placing an electrically and thermally conductive package lid over the integrated circuit, wherein the electrically and thermally conductive package lid is in electrical communication with at least one of the plurality of electrically conductive portions of the integrated circuit, wherein the package lid is in thermal communication with the integrated circuit, and wherein the package base and the package lid form a hermetic seal around the integrated circuit.

18. The method of claim 17, wherein the electrically and thermally conductive package lid comprises a substantially electrically nonconductive substrate defining a surface, a metal layer applied to the surface of the substrate, an electrically conductive plane, and an electrically conductive via electrically connecting the metal layer and the electrically conductive plane through the substrate, and wherein placing the electrically and thermally conductive package lid of over the integrated circuit comprises placing the metal layer over the integrated circuit to electrically connect at least one electrically conductive portion of the plurality of electrically conductive portions and the metal layer.

19. The method of claim 17, further comprising:
forming the plurality of openings in the passivation layer of the integrated circuit to define the plurality of electrically conductive portions; and
applying an electrically and thermally conductive interface material over at least one electrically conductive portion of the plurality of electrically conductive portions of the integrated circuit prior to placing the electrically and thermally conductive package lid over the integrated circuit.

* * * * *